United States Patent
Boezen et al.

(10) Patent No.: US 6,326,817 B1
(45) Date of Patent: Dec. 4, 2001

(54) CIRCUIT FOR SUPPRESSING A COMMON MODE COMPONENT IN A SIGNAL FROM A CAN COMMUNICATION BUS

(75) Inventors: Hendrik Boezen; Abraham Klaas Van Den Heuvel, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/561,473

(22) Filed: Apr. 27, 2000

(30) Foreign Application Priority Data

Apr. 28, 1999 (EP) .................................................. 99201312

(51) Int. Cl.[7] .................................................. H03R 5/153
(52) U.S. Cl. .............................................. 327/90; 327/331
(58) Field of Search .................................. 327/63, 68, 69, 327/70, 72, 77, 90, 551, 563, 806, 331; 714/4, 43

(56) References Cited

U.S. PATENT DOCUMENTS

| | | | |
|---|---|---|---|
| 4,280,221 | * | 7/1981 | Chun et al. ............................ 375/17 |
| 5,179,577 | * | 1/1993 | Ilyadis .................................... 375/76 |
| 5,187,448 | * | 2/1993 | Brooks et al. ....................... 330/258 |
| 5,216,674 | * | 6/1993 | Peter et al. ............................. 714/43 |
| 5,357,518 | * | 10/1994 | Peter ........................................ 714/4 |
| 5,448,200 | * | 9/1995 | Fernadez et al. .................... 327/560 |
| 5,475,323 | * | 12/1995 | Harris et al. ........................... 327/67 |
| 5,572,658 | * | 11/1996 | Mohr et al. .............................. 714/4 |
| 6,037,798 | * | 3/2000 | Hedberg ................................. 326/30 |

FOREIGN PATENT DOCUMENTS

9828886A2   7/1998   (WO) .

* cited by examiner

Primary Examiner—Timothy P. Callahan
Assistant Examiner—Hai L. Nguyen
(74) Attorney, Agent, or Firm—Steven R. Biren

(57) ABSTRACT

The common mode component in the difference signal on the bus terminals (2, 4) of a CAN bus is counteracted by four transistors (M1–M4) connected between the supply terminals (28, 32) and a center tap (16) of a voltage divider (6A, 6B, 8, 10, 12A, 12B) between the bus terminals (2, 4). As a result of this, the voltage on the center tap (16) varies to a substantially smaller extent or not at all. Thus, it is possible to use a simpler differential amplifier (20) having a smaller common mode swing at the inputs (22, 24). Moreover, the attenuation factor selected for the voltage divider can be smaller, as a result of which a higher difference voltage is available for the differential amplifier (20).

2 Claims, 1 Drawing Sheet

CIRCUIT FOR SUPPRESSING A COMMON MODE COMPONENT IN A SIGNAL FROM A CAN COMMUNICATION BUS

BACKGROUND OF THE INVENTION

The invention relates to a circuit for suppressing a common mode component in a signal from a communication bus, comprising:

- a first supply terminal and a second supply terminal for the connection of a supply voltage,
- a first bus terminal and a second bus terminal for the connection of respective wires of the communication bus,
- a voltage divider connected between the first bus terminal and the second bus terminal,
- a differential amplifier having inputs connected to taps of the voltage divider,
- a first current conducting element for coupling a center tap of the voltage divider to the first supply terminal, and
- a second current conducting element for coupling the center tap of the voltage divider to the second supply terminal.

Such a circuit is used in so-called Controller Area Network (CAN) bus systems, which are used inter alia in cars. Such a communication bus has transceivers (transmitter/receiver) connected to its first and its second bus terminal for the transmission and reception of information, which is transferred as a difference signal over the two wires of the communication bus. The two bus wires, which are commonly referred to as CANH and CANL, are often long and susceptible to high-frequency electromagnetic interference. Such interference has the same influence on both wires and consequently manifests itself as a common mode component in the difference signal.

In the customary circuit the voltage divider attenuates the signal voltages on the bus wires CANH and CANL in order to suppress the common mode component. By means of two current conducting elements, usually resistors, the center tap of the voltage divider is set to a fixed voltage, frequently half the supply voltage. The attenuated signal, to be processed by the differential amplifier, is available at the taps. As a result of the attenuation the useful difference signal is attenuated likewise. The choice of the attenuation factor is a compromise which depends on the common mode swing of the differential amplifier and the envisaged maximum common mode voltage. The detection of the useful difference signal becomes more inaccurate as the attenuation is higher.

SUMMARY OF THE INVENTION

It is an object of the invention to provide a circuit for suppressing the common mode component having improved characteristics. To this end, the circuit of the type defined in the opening paragraph is characterized in that the first current conducting element comprises a first pair of transistors of a first conductivity type arranged in parallel and having their control electrodes connected to further taps of the voltage divider, and the second current conducting element comprises a second pair of transistors of a second conductivity type arranged in parallel and having their control electrodes connected to the further taps of the voltage divider.

Owing to these measures the common mode voltage variation on the center tap becomes less dependent on the common mode voltage variation on the bus wires CANH and CANL. As a result of this, the differential amplifier needs to handle a smaller common mode swing and can therefore be of simpler design. The attenuation factor chosen for the voltage divider can also be smaller, as a result of which the useful difference signal at the inputs of the differential amplifier is larger. This improves the accuracy and the speed of detection of the difference signal.

It is to be noted that FIG. 2 of the International Application WO 98/28886 shows a circuit for suppressing the common mode component, which also has a differential amplifier and two transistor pairs of opposite conductivity types arranged in parallel. However, this known amplifier does not have a voltage divider and the differential amplifier and the transistor pairs are connected differently.

BRIEF DESCRIPTION OF THE DRAWING

The invention will now be described in more detail with reference to the accompanying drawing, in which.

In these Figures like elements bear the same reference symbols.

DESCRIPTION OF THE PREFERRED EMBODIMENTS

Figure 1:
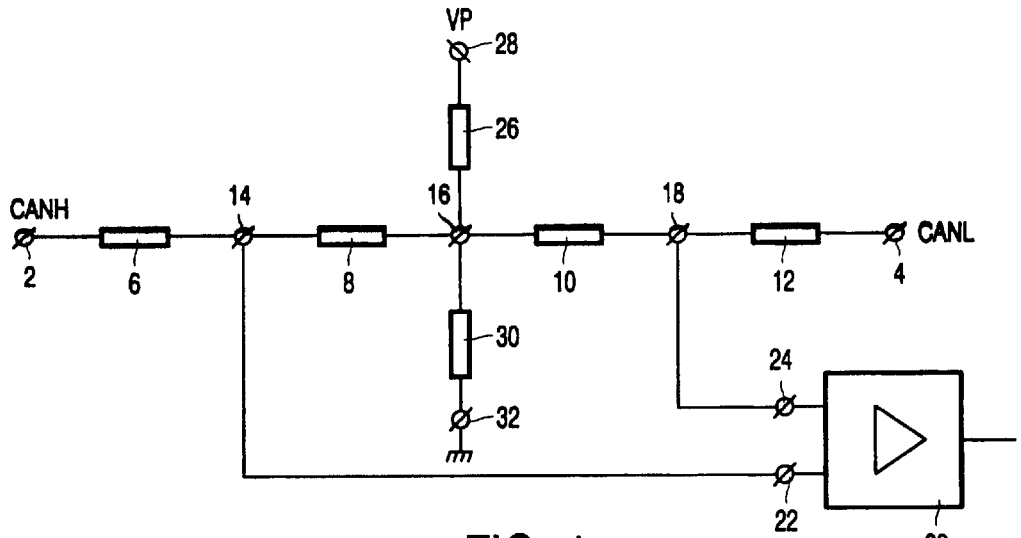
FIG. 1 shows a known circuit for suppressing a common mode component in a signal from a communication bus.

FIG. 1 shows a known circuit for suppressing a common mode component in a signal from a communication bus. The circuit forms part of a receiver for a CAN bus system but obviously it may also be employed in any other two-wire signal transmission system. Data signals transmitted via the bus wires CANH and CANL are received by the receiver. The bus wires CANH and CANL are connected to, respectively, a first bus terminal 2 and a second bus terminal 4, between which a voltage divider is connected which comprises four resistors 6, 8, 10 and 12 arranged in series. The resistor 6 is connected between the first bus terminal 2 and a first tap 14, the resistor 8 is connected between the first tap 14 and a center tap 16, the resistor 10 is connected between the center tap 16 and a second tap 18, and resistor 12 is connected between the second tap 18 and the second bus terminal 4. A differential amplifier or comparator 20 has its inputs 22 and 24 connected to the first tap 14 and the second tap 18, respectively. A first current conducting element, in the present case a resistor 26, is connected between the center tap 16 and a positive supply terminal 28 for the application of a positive supply voltage VP. A second current conducting element, in the present case a resistor 30, is connected between the center tap 16 and a negative supply terminal 32 connected to ground.

The resistors 26 and 30 define the operating point of the difference signal on the inputs 22 and 24 of the differential amplifier 20. The voltage divider comprising the resistors 6, 8, 10, 12 attenuates the common mode component in the difference signal on he bus wires CANH and CANL and brings this component within the range that can be handled at the inputs 22 and 24 of the differential amplifier 20. However, as a result of the attenuation the useful difference signal component is also attenuated, which is undesirable in view of the accuracy and the speed of the useful difference signal detection.

Figure 2:
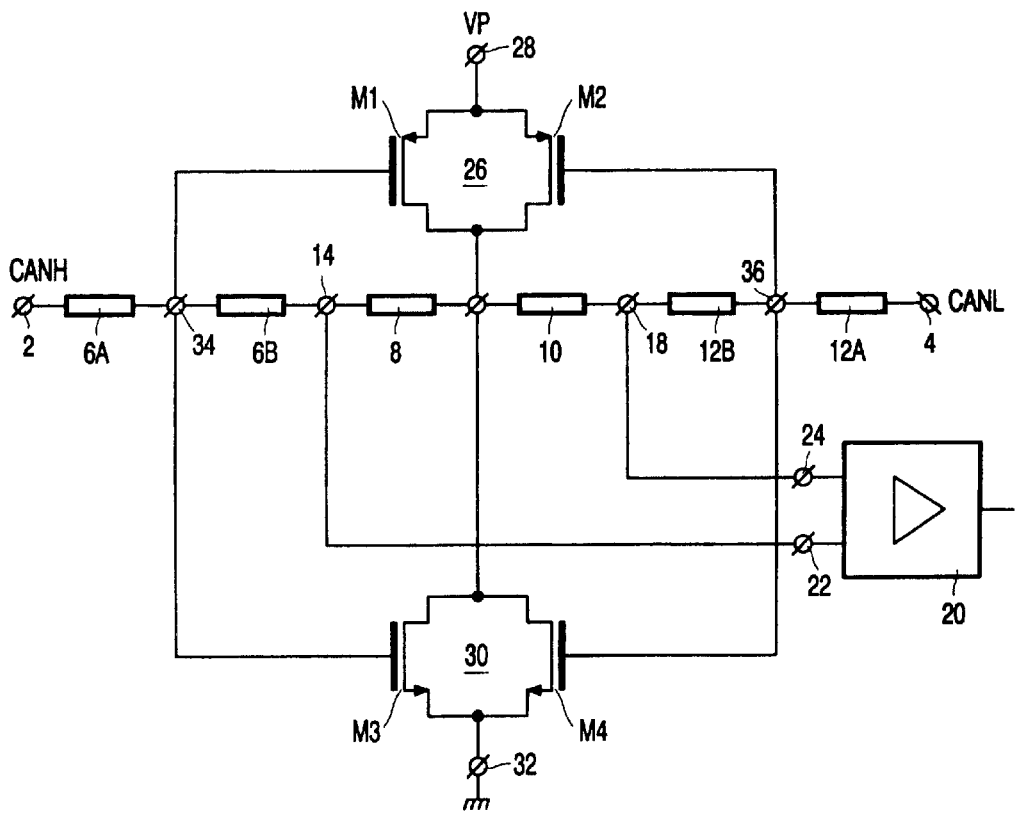
FIG. 2 shows a circuit in accordance with the invention for suppressing a common mode component in a signal from a communication bus.

FIG. 2 shows a circuit in accordance with the invention for suppressing a common mode component in a signal from a communication bus. The resistor 6 is split into a resistor 6A between the first bus terminal 2 and a third tap 34, and a resistor 6B between the third tap 34 and the first tap 14. Likewise, the resistor 12 is split into a resistor 12A between the second bus terminal 4 and a fourth tap 26, and a resistor 12B between the fourth tap 36 and the second tap 18. The resistor 26 is replaced with two PMOS transistors M1 and M2 which are arranged in parallel and which have their control electrodes or gates connected to the third tap 34 and the fourth tap 36, respectively. Likewise, the resistor 30 is replaced with two NMOS transistors M3 and M4 which are arranged in parallel and which have their control electrodes connected to the third tap 34 and the fourth tap 36, respectively. If desired, bipolar transistors may be used instead of MOS transistors.

For example, if the voltage on the first bus terminal 2 increases, the gate voltage of the transistor M3 increases and the gate voltage of the transistor M1 decreases. As a result of this, the voltage on the center tap 16 decreases. The opposite happens if the voltage on the first bus terminal 2 decreases; the voltage on the center tap 16 then increases. The same holds for the response to the voltage variation on the second bus terminal 4. Thus, the common mode component is counteracted. By a suitable choice of the proportions of the resistors and the sizes of the transistors it can be achieved that the voltages on the first tap 14 and the second tap 18 become substantially independent of the common mode voltage on the bus terminals 2 and 4. A correct operation of the circuit is maintained even when the gate voltages become higher than the positive supply voltage VP or lower than ground potential. By counteracting the common mode component it is possible to use a differential amplifier or comparator having a smaller common mode swing at the input. Moreover, the attenuation factor of the voltage divider can be reduced, as a result of which a higher useful difference voltage is obtained at the inputs 22 and 24. This improves the accuracy and speed of the difference signal detection.

What is claimed is:

1. A circuit for suppressing a common mode component in a signal from a communication bus, comprising:

a first supply terminal (28) and a second supply terminal (32) for the connection of supply voltages, a first bus terminal (2) and a second bus terminal (4) for the connection of respective wires (CANH, CANL) of the communication bus, a voltage divider (6, 8, 10, 12) connected between the first bus terminal (2) and the second bus terminal (4), a differential amplifier (20) having inputs (22, 24) connected to taps (14, 18) of the voltage divider, a first current conducting element (26) for coupling a center tap (16) of the voltage divider to the first supply terminal (28), and a second current conducting element (30) for coupling the center tap (16) of the voltage divider to the second supply terminal (32), characterized in that the first current conducting element (26) comprises a first pair of transistors (M1, M2) of a first conductivity type arranged in parallel and having their control electrodes connected to further taps (34, 36) of the voltage divider, and the second current conducting element (30) comprises a second pair of transistors (M2, M4) of a second conductivity type arranged in parallel and having their control electrodes connected to the further taps (34, 36) of the voltage divider.

2. A circuit as claimed in claim 1, characterized in that the further taps (34, 36) of the voltage divider are situated farther away from the center tap (16) than the taps (14, 18) to which the inputs (22, 24) of the differential amplifier (20) are connected.

* * * * *